(12) United States Patent
Kenzaki

(10) Patent No.: US 11,719,762 B2
(45) Date of Patent: Aug. 8, 2023

(54) PROBE FITTING STRUCTURE AND PROBE

(71) Applicant: Murata Manufacturing Co., Ltd., Kyoto-fu (JP)

(72) Inventor: Shinichi Kenzaki, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 259 days.

(21) Appl. No.: 17/331,336

(22) Filed: May 26, 2021

(65) Prior Publication Data
US 2021/0278480 A1    Sep. 9, 2021

Related U.S. Application Data

(63) Continuation of application No. PCT/JP2019/045857, filed on Nov. 22, 2019.

(30) Foreign Application Priority Data

Nov. 29, 2018 (JP) .................................. 2018-223627

(51) Int. Cl.
*G01R 31/66* (2020.01)
*G01R 1/067* (2006.01)

(52) U.S. Cl.
CPC .............. *G01R 31/66* (2020.01); *G01R 1/067* (2013.01)

(58) Field of Classification Search
CPC .................................. G01R 1/66; G01R 1/067
See application file for complete search history.

(56) References Cited

FOREIGN PATENT DOCUMENTS

| CN | 201716340 U | * | 1/2011 |
|---|---|---|---|
| JP | S60-095943 A | | 5/1985 |
| JP | S62-005280 U | | 1/1987 |
| JP | H0915448 A | * | 1/1997 |
| JP | H0943298 A | * | 2/1997 |
| JP | 2000-162237 A | | 6/2000 |
| JP | 2007-263726 A | | 10/2007 |
| JP | 2012-068076 A | | 4/2012 |
| WO | 2016/072193 A1 | | 5/2016 |
| WO | 2018/116568 A1 | | 6/2018 |

OTHER PUBLICATIONS

International Search Report issued in PCT/JP2019/045857; dated Feb. 4, 2020, six pages.
Written Opinion issued in PCT/JP2019/045857; dated Feb. 4, 2020, Ten pages.

* cited by examiner

*Primary Examiner* — Paresh Patel
(74) *Attorney, Agent, or Firm* — Studebaker & Brackett PC

(57) ABSTRACT

A probe fitting structure includes a connector to be inspected and a probe capable of being fitted to the connector. The connector includes a plurality of connection electrodes. The probe includes a flange having a through hole and used for attaching the probe to a device, a coaxial cable extending through the through hole and including a leading end portion to which a probe pin is attached, a plunger including a leading end through which the probe pin is exposed, and a spring housing the coaxial cable between the flange and the plunger and including a first end portion fixed to the flange and a second end portion fixed to the plunger. The plunger includes a plunger-side fitting portion in a leading end portion of the plunger. The connector includes a connector-side fitting portion (opening portion) capable of being fitted to the plunger-side fitting portion.

11 Claims, 10 Drawing Sheets

PROBE FITTING STRUCTURE AND PROBE

CROSS-REFERENCE TO RELATED APPLICATIONS

This application claims benefit of priority to International Patent Application No. PCT/JP2019/045857, filed Nov. 22, 2019, and to Japanese Patent Application No. 2018-223627, filed Nov. 29, 2018, the entire contents of each are incorporated herein by reference.

BACKGROUND

Technical Field

The present disclosure relates to a probe fitting structure for connecting a probe to a connection electrode of a multipole connector and inspecting characteristics of a circuit on which the multipole connector is disposed in electronic equipment and to the probe.

Background Art

International Publication No. 2018/116568 discloses an disclosure relating to a probe fitting structure including a connector to be inspected and a probe capable of being fitted to that connector. International Publication No. 2018/116568 illustrates a structure including the probe including a trumpet-shaped tapered portion with its cavity wider in its leading end direction and the connector having an outer frame portion allowing the tapered portion of the probe to be fitted thereto. The above probe is guided by sliding of its tapered portion along the outer frame portion of the connector, and both are fitted in a proper relationship.

SUMMARY

As described above, the connector to be inspected is mounted on a circuit board, and with the increase in the component mounting density or integration degree of the circuit board, the gap between the connector and other components decreases.

When the probe illustrated in International Publication No. 2018/116568 is fitted to the connector mounted on the circuit board, the trumpet-shaped tapered portion of the probe, the tapered portion being a size larger than the connector, extends beyond the connector. Therefore, if other components are mounted around the connector on the circuit board, a problem may arise in that the probe comes into contact with the components, interfere with them, or break them.

To avoid the above problem, if space where other components are not mounted or placed is provided around the connector, in the case of a circuit board such as the one used inside a smartphone, because the integration degree of components in the circuit board is reduced, a problem arises in that the miniaturization of the smartphone is hindered.

Accordingly, the present disclosure provides a probe fitting structure and a probe capable of avoiding the interference with and breakage of components mounted near a connector without reducing the component mounting density or the integration degree of a circuit board on which the connector is mounted.

A probe fitting structure as an example of the present disclosure is a probe fitting structure including a connector to be inspected and a probe capable of being fitted to the connector, the connector including a plurality of connection electrodes arranged. The probe includes a flange having a through hole, a coaxial cable extending through the through hole and including a leading end portion to which at least one probe pin is attached, a plunger including a leading end through which the at least one probe pin is exposed, and a spring housing the coaxial cable between the flange and the plunger and including a first end portion fixed to the flange and a second end portion fixed to the plunger. The plunger includes at least one plunger-side fitting portion in a leading end portion thereof. The connector includes at least one connector-side fitting portion capable of being fitted to the at least one plunger-side fitting portion while being in contact with an outer side surface thereof.

A probe fitting structure as another example of the present disclosure is a probe fitting structure including a connector to be inspected and a probe capable of being fitted to the connector, the connector including a plurality of connection electrodes arranged. The probe includes a flange having a through hole, a coaxial cable extending through the through hole and including a leading end portion to which at least one probe pin is attached, a plunger including a leading end through which the at least one probe pin is exposed, and a spring housing the coaxial cable between the flange and the plunger and including a first end portion fixed to the flange and a second end portion fixed to the plunger. The plunger includes at least one plunger-side fitting portion in a leading end portion thereof. The connector includes at least one connector-side fitting portion capable of being fitted to the at least one plunger-side fitting portion while surrounding it.

A probe as another example of the present disclosure is a probe for inspecting a connector including a connection electrode. The probe includes a flange having a through hole, a coaxial cable extending through the through hole, a plunger having a planar base end portion, and a probe pin attached to the coaxial cable and including a leading end exposed from the base end portion. The plunger includes a plurality of protruding portions between which the probe pin is disposed when the base end portion is seen in plan view. A length from the base end portion to a leading end of each of the plurality of protruding portions is longer than a length from the base end portion to the leading end of the probe pin.

According to the probe fitting structure and the probe in the present disclosure, the interference with and breakage of the components mounted near the connector can be avoided without reducing the component mounting density or integration degree of the circuit board on which the connector is mounted.

DETAILED DESCRIPTION

Figure 1:
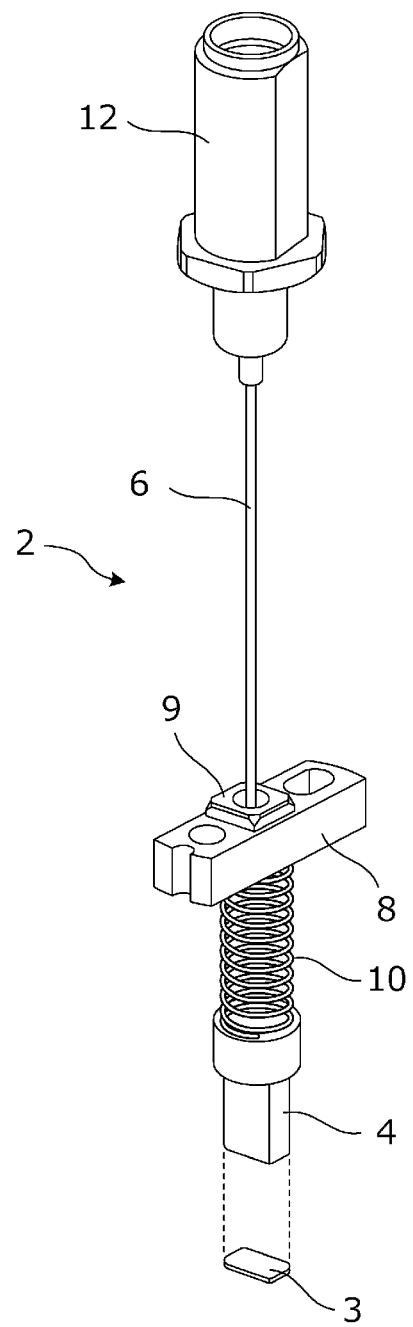
FIG. 1 is a perspective view of a probe fitting structure according to a first embodiment.

First, some aspects of a probe fitting structure according to the present disclosure are described.

A probe fitting structure according to a first aspect of the present disclosure includes a connector to be inspected and a probe capable of being fitted to the connector, the connector including a plurality of connection electrodes arranged. The probe includes a flange having a through hole and used for attaching the probe to a device, a coaxial cable extending through the through hole and including a leading end portion to which at least one probe pin is attached, a plunger including a leading end through which the at least one probe pin is exposed, and a spring housing the coaxial cable between the flange and the plunger and including a first end portion fixed to the flange and a second end portion fixed to the plunger. The plunger includes at least one plunger-side fitting portion in a leading end portion thereof. The connector includes at least one connector-side fitting portion capable of being fitted to the at least one plunger-side fitting portion while being in contact with an outer side surface thereof.

According to the above probe fitting structure, because it is not necessary for the plunger to include a trumpet-shaped tapered portion with its cavity wider in the leading end direction, the planar size of the plunger can be similar to or smaller than that of the connector. Thus, there is no need to provide space where other components are not mounted or placed around the connector, and the component mounting density or integration degree of the circuit board does not decrease. The interference with and breakage of components mounted near the connector can be avoided.

A probe fitting structure according to a second aspect of the present disclosure includes a connector to be inspected and a probe capable of being fitted to the connector, the connector including a plurality of connection electrodes arranged. The probe includes a flange having a through hole and used for attaching the probe to a device, a coaxial cable extending through the through hole and including a leading end portion to which at least one probe pin is attached, a plunger including a leading end through which the at least one probe pin is exposed, and a spring housing the coaxial cable between the flange and the plunger and including a first end portion fixed to the flange and a second end portion fixed to the plunger. The plunger includes at least one plunger-side fitting portion in a leading end portion thereof. The connector includes at least one connector-side fitting portion capable of being fitted to the at least one plunger-side fitting portion while surrounding it.

According to the above probe fitting structure, because it is not necessary for the plunger to include a trumpet-shaped tapered portion with its cavity wider in the leading end direction, the planar size of the plunger can be similar to or smaller than that of the connector. Thus, there is no need to provide space where other components are not mounted or placed around the connector, and the component mounting density or integration degree of the circuit board does not decrease. The interference with and breakage of components mounted near the connector can be avoided.

In the probe fitting structure according to a third aspect of the present disclosure, the at least one probe pin may include a plurality of probe pins, the connector may include the plurality of connection electrodes allowing the probe pins to come into contact therewith, the plurality of connection electrodes may be in positions having 180-degree rotational symmetry in an orthogonal plane to a direction in which the probe comes into contact or becomes separated, and the plurality of probe pins may be disposed in positions where they come into contact with different respective connection electrodes of the plurality of connection electrodes before and after the 180-degree rotation about a central axis of the 180-degree rotation of the connector. According to that structure, because the probe pins can come into contact with different respective connection electrodes of the plurality of connection electrodes of the connector in two fitting states of 180-degree rotational symmetry, the connection electrodes with which the plurality of probe pins come into contact in the two states do not overlap. Therefore, a small number of probe pins can come into contact with a large number of connection electrodes.

In the probe fitting structure according to a fourth aspect of the present disclosure, the connector may include the plurality of connection electrodes, and the at least one probe pin may include a plurality of probe pins capable of coming into contact with all of the plurality of connection electrodes in a one-to-one relationship. According to that structure, measurement can be conducted for all of the connection electrodes in a single fitting state.

In the probe fitting structure according to a fifth aspect of the present disclosure, the at least one connector-side fitting portion may include a plurality of connector-side fitting portions in places between which an area where the plurality of connection electrodes are arranged is disposed, and the at least one plunger-side fitting portion may be fitted to each of the plurality of connector-side fitting portions. According to that structure, because the connector and the plunger can be fitted in the plurality of discrete places, the strength of fitting the plunger to the connector and its positional accuracy can be enhanced.

In the probe fitting structure according to a sixth aspect of the present disclosure, the plurality of connection electrodes may be arranged in a row, and the at least one plunger-side fitting portion may have a shape extending along the row within an area where the plurality of connection electrodes are arranged. According to that structure, because the place where the connector and the plunger are fitted can be long, the strength of fitting the plunger to the connector and its positional accuracy can be enhanced.

In the probe fitting structure according to a seventh aspect of the present disclosure, the at least one plunger-side fitting portion may be a protruding portion, the at least one connector-side fitting portion may be a depression allowing the plunger-side fitting portion to be inserted therein, and the protruding portion may have a cut portion for providing a clearance from the connection electrodes or a holding portion for the connection electrodes. According to that structure, the interference between the plunger-side fitting portion and the connection electrodes of the connector or the holding portion for the connection electrodes in the state where the plunger-side fitting portion is fitted to the connector-side fitting portion can be effectively prevented.

In the probe fitting structure according to an eighth aspect of the present disclosure, both or one of the protruding portion and the depression may include a slope portion where its leading end portion is thinner than its base end portion in a direction of the insertion, and the slope portion may be used for guiding the protruding portion to a proper position with respect to the depression. According to that structure, when the plunger is inserted in the connector, both can be guided to a proper positional relationship, and the operability in fitting can be enhanced.

A probe according to a ninth aspect of the present disclosure is a probe for inspecting a connector including a connection electrode. The probe includes a flange having a through hole, a coaxial cable extending through the through hole, a plunger having a planar base end portion, and a probe pin attached to the coaxial cable and including a leading end exposed from the base end portion. The plunger includes a plurality of protruding portions between which the probe pin is disposed when the base end portion is seen in plan view. A length from the base end portion to a leading end of each of the plurality of protruding portions is longer than a length from the base end portion to the leading end of the probe pin.

According to the above probe, the collision of the probe pin with a member different from an electrode to be measured of the connector before fitting can be suppressed. The effects of noise from the outside can also be suppressed.

In the probe according to a tenth aspect of the present disclosure, when the base end portion of the plunger is seen in plan view, the probe pin may be positioned within an area surrounded by an outer shape line of a group of the plurality of protruding portions. According to that structure, the collision of the probe pin with a member different from an electrode to be measured of the connector before fitting can be effectively suppressed. The effects of noise from the outside can also be effectively suppressed.

A plurality of embodiments for carrying out the present disclosure are described below by using some concrete examples with reference to the drawings. In the drawings, the same reference numerals are used in the same portions. The embodiments are separately illustrated for the sake of explanation in consideration of explanation of main points or ease of understanding, and the configurations illustrated in different embodiments can be replaced or combined in part. The description of matters in second and subsequent embodiments common to those in a first embodiment is omitted, and only different points are described. In particular, similar operational advantages from similar configurations are not individually mentioned for each embodiment.

First Embodiment

Figure 2:
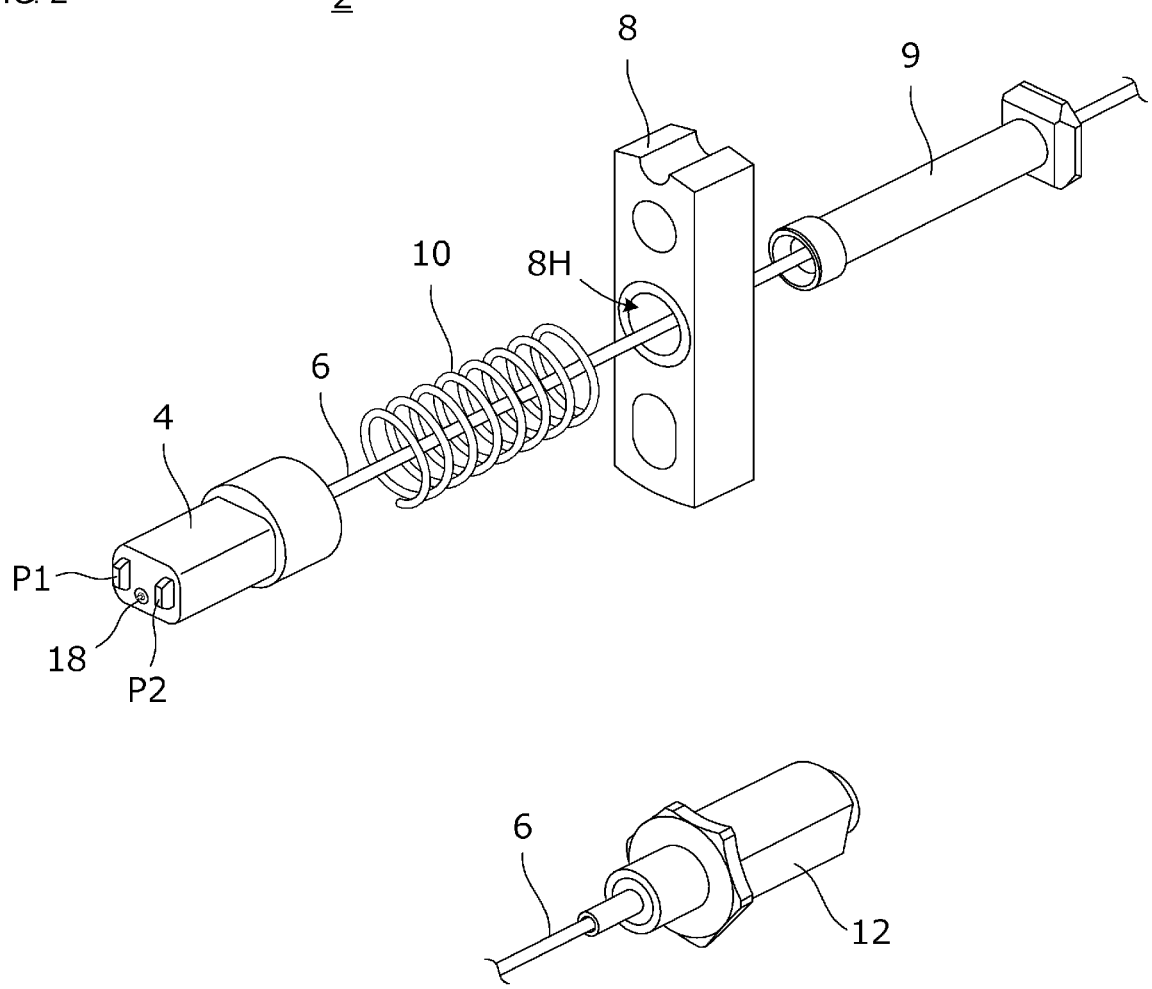
FIG. 2 is a perspective view of a probe before it is assembled.
Figure 3:
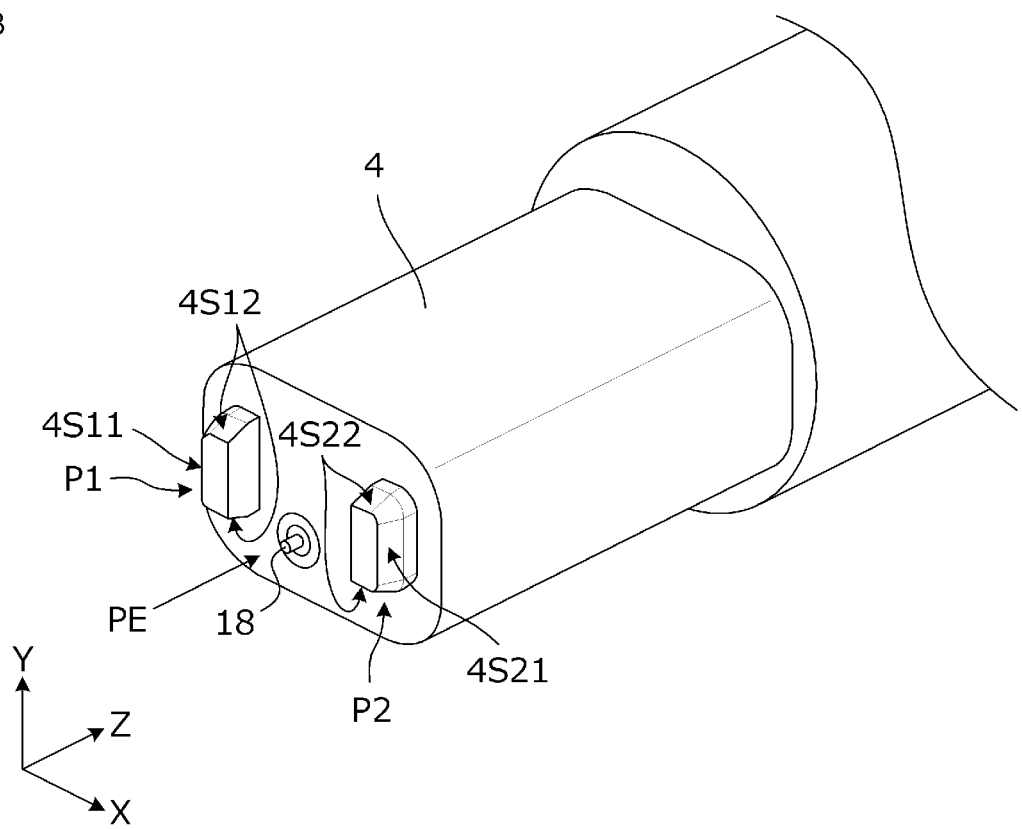
FIG. 3 is an enlarged perspective view of a leading end portion of a plunger.

FIG. 1 is a perspective view of a probe fitting structure 101 according to a first embodiment. FIG. 2 is a perspective view of a probe 2 before it is assembled. FIG. 3 is an enlarged perspective view of a leading end portion of a plunger 4.

The probe 2 is an inspection device for inspecting characteristics of an electronic circuit coupled to a connector 3 to which the probe 2 is connected, the connector 3 mounted on a circuit board in electronic equipment. The connector 3 is a multipole connector including a plurality of connection electrodes. A coaxial connector 12 is connected to a coaxial receptacle of a measuring instrument.

As illustrated in FIGS. 1 and 2, the probe 2 includes the plunger 4, a coaxial cable 6, a spring 10, a flange 8, a coupling member 9, and the coaxial connector 12.

As illustrated in FIG. 2, the flange 8 has a through hole 8H through which the coaxial cable 6 extends. The coupling member 9 is a coupling member for coupling the plunger 4 and the flange 8 with the spring 10 disposed therebetween. The plunger 4 is elastically held to the flange 8 with the spring 10 disposed therebetween.

The plunger 4, the flange 8, and the coupling member 9 may be made of, for example, stainless steel. The spring 10 may be made of, for example, beryllium copper.

At a leading end portion of the plunger 4, a probe pin 18 and protruding portions P1 and P2 protrude through a leading end surface of the plunger. The "leading end surface of the plunger" is the leading end surface of the plunger 4 facing the connector 3. The probe pin 18 is a pin attached to the coaxial cable 6 and electrically connected to the inner conductor of the coaxial cable 6. The outer conductor of the coaxial cable 6 is electrically connected to the plunger 4. The protruding portions P1 and P2 correspond to a "plunger-side fitting portion" according to the present disclosure. A portion of the probe pin 18 that does not protrude from the leading end of the plunger 4 has a coaxial structure formed by covering the gap between that portion and the plunger 4 with a bushing (resin member).

As illustrated in FIG. 3, the protruding portion P1 includes slope portions 4S11 and 4S12, and the protruding portion P2 includes slope portions 4S21 and 4S22. The actions of these slope portions 4S11, 4S12, 4S21, and 4S22 are described below. The plunger includes the plurality of (two in this example) protruding portions P1 and P2 between which the probe pin 18 is disposed when the base end portion PE is seen in plan view. The length from the base end portion PE to the leading end of each of the protruding portions P1 and P2 is longer than the length from the base end portion PE to the leading end of the probe pin 18.

Figure 4A:
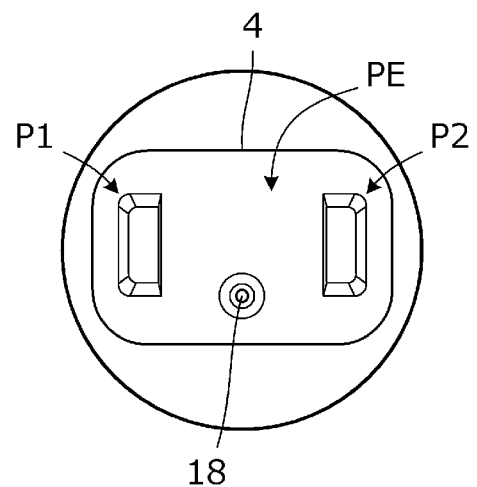
FIG. 4A is an enlarged plan view of a base end portion of the plunger.
Figure 4B:
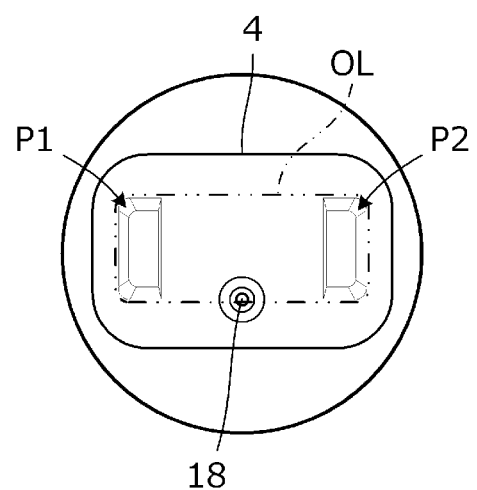
FIG. 4B illustrates a positional relationship between protruding portions and a probe pin.

FIG. 4A is an enlarged plan view of the base end portion PE of the plunger 4. FIG. 4B illustrates a positional relationship between the protruding portions P1 and P2 and the probe pin 18 at the base end portion PE. In FIG. 4B, an outer shape line OL of the group of the two protruding portions P1 and P2 is illustrated. When the base end portion PE of the plunger 4 is seen in plan view, a part of the probe pin 18 is positioned within the area surrounded by the outer shape line OL of the group of the plurality of (two in this example) protruding portions P1 and P2.

Figure 5:
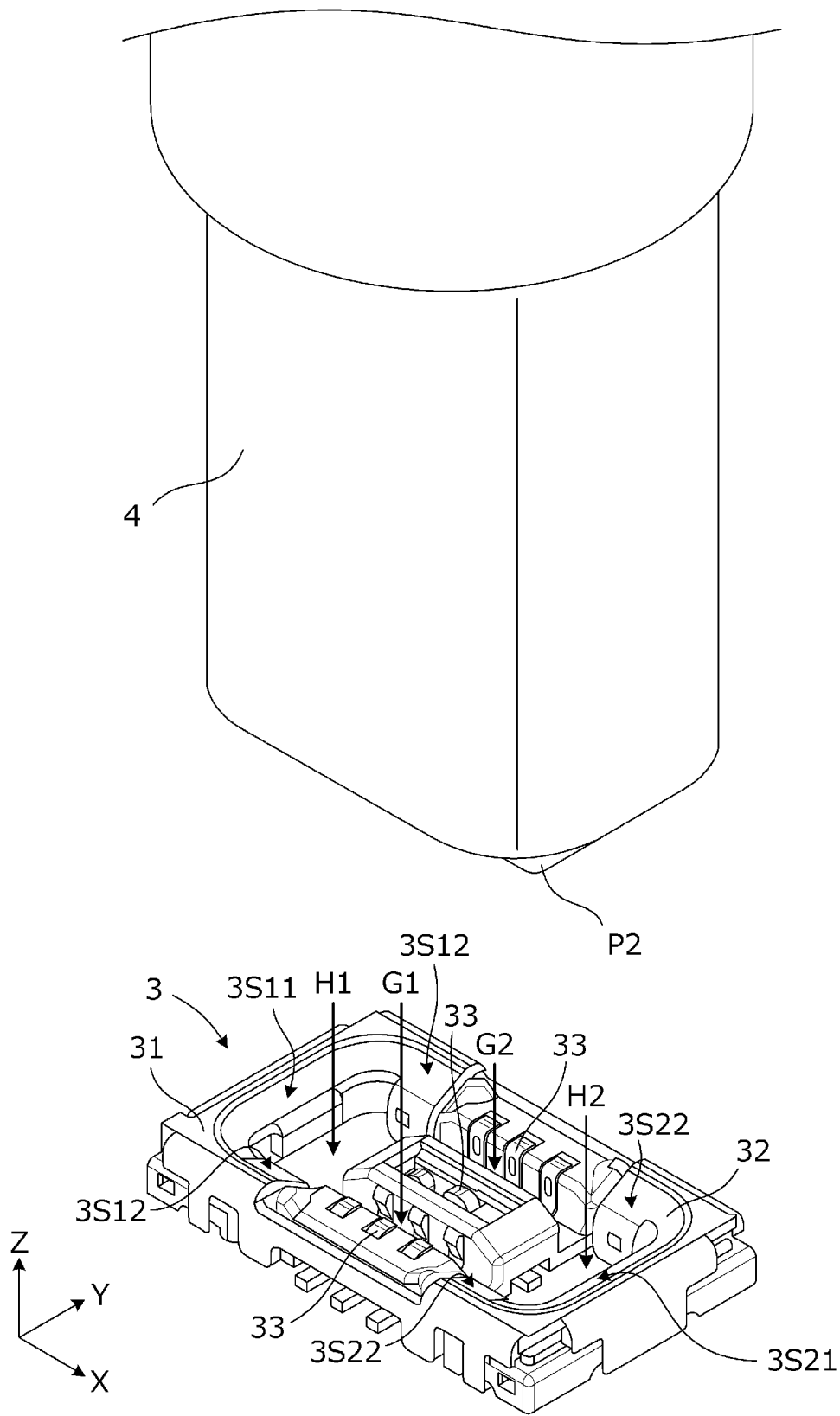
FIG. 5 is a perspective view of a connector and a part of the plunger facing that connector.
Figure 7:
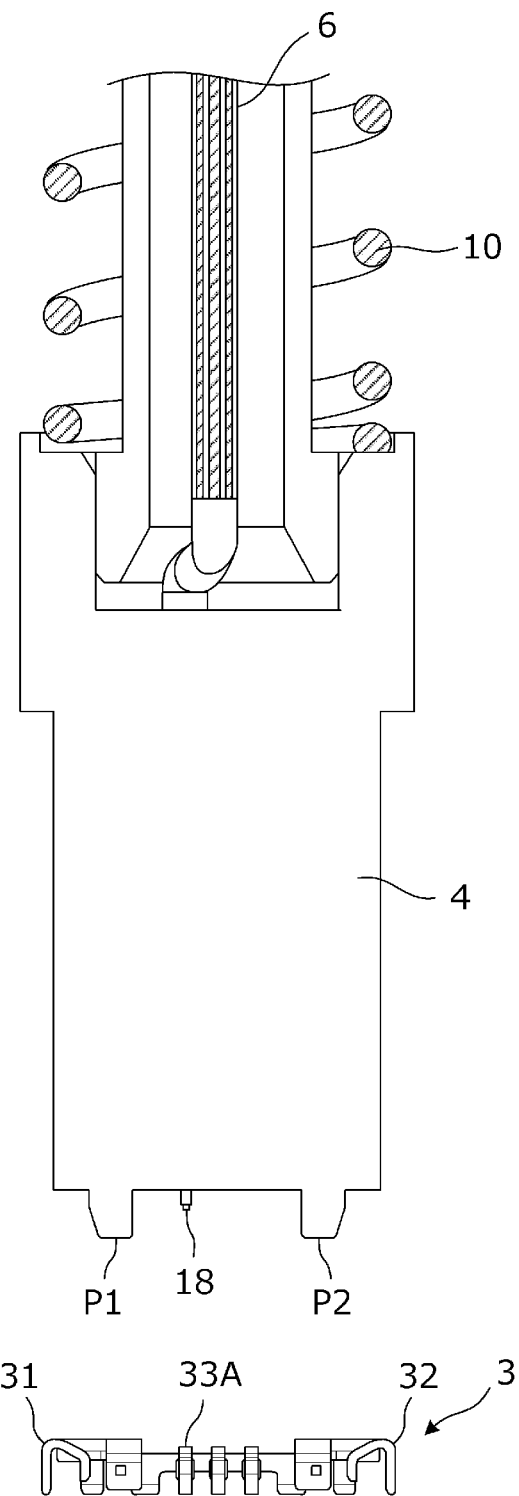
FIG. 7 illustrates a vertical section of the connector and a part of the plunger facing that connector.

FIG. 5 is a perspective view of the connector 3 and a part of the plunger 4 facing that connector 3. FIG. 7 illustrates a vertical section of the connector 3 and a part of the plunger 4 facing that connector 3. The connector 3 has opening portions H1 and H2 allowing the protruding portions P1 and P2 of the plunger 4 illustrated in FIG. 3 to be fitted thereto. The opening portions H1 and H2 correspond to a "connector-side fitting portion" according to the present disclosure. As described below, the protruding portions P1 and P2 of the plunger 4 slide along metal frames 31 and 32 of the connector 3 and are fitted. In that fitting, the opening portions H1 and H2 of the connector 3 are in contact with outer side surfaces of the protruding portions P1 and P2 of the plunger 4. In that fitting, the opening portions H1 and H2 of the connector 3 surround the protruding portions P1 and P2 of the plunger 4.

The connector 3 is a molding of a metal material and a resin. As illustrated in FIG. 5, the connector 3 includes a plurality of connection electrodes 33 and the metal frames 31 and 32. The metal frames 31 and 32, which are a continuous component, are described with different reference numerals for the sake of explanation.

As illustrated in FIG. 5, the metal frame 31 includes slope portions 3S11 and 3S12, and the metal frame 32 includes slope portions 3S21 and 3S22. The actions of these slope portions 3S11, 3S12, 3S21, and 3S22 are described below.

Figure 6:
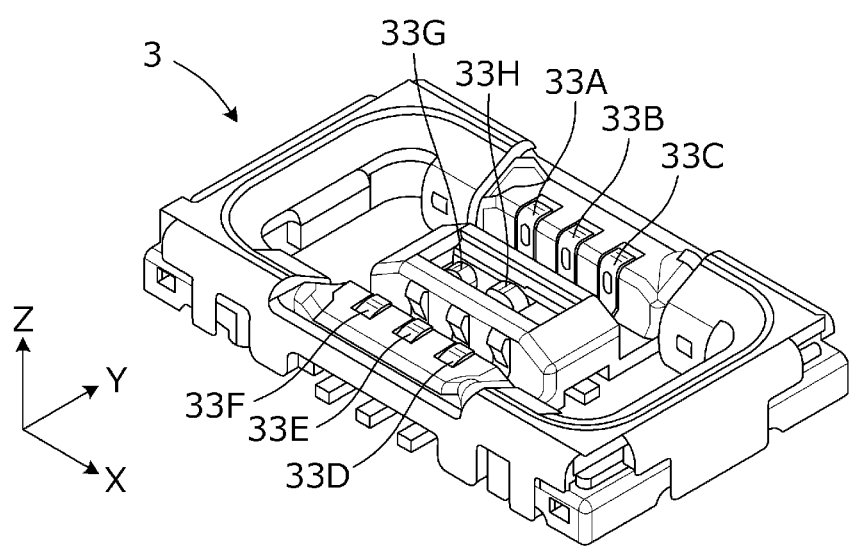
FIG. 6 is a perspective view that illustrates a plurality of connection electrodes included in the connector and labeled with individual reference numerals.

FIG. 6 is a perspective view that illustrates the plurality of connection electrodes included in the connector 3 and labeled with individual reference numerals. The plurality of connection electrodes 33 illustrated in FIG. 5 consist of connection electrodes 33A, 33B, 33C, 33D, 33E, 33F, 33G, and 33H. Among those connection electrodes, the connection electrodes 33A and 33F are rotationally symmetric by 180 degrees in an orthogonal plane (X-Y plane) to a direction in which the probe 2 comes into contact or becomes separated (Z direction). Similarly, the connection electrodes 33C and 33D are rotationally symmetric by 180 degrees. The connection electrodes 33B and 33E are rotationally symmetric by 180 degrees. The connection electrodes 33G and 33H are rotationally symmetric by 180 degrees.

In the state where the plunger 4 is fitted to the connector 3 illustrated in FIG. 7, the probe pin 18 comes into contact with the predetermined connection electrode 33A among the plurality of connection electrodes of the connector 3 and becomes electrically connected thereto.

Figure 8A:
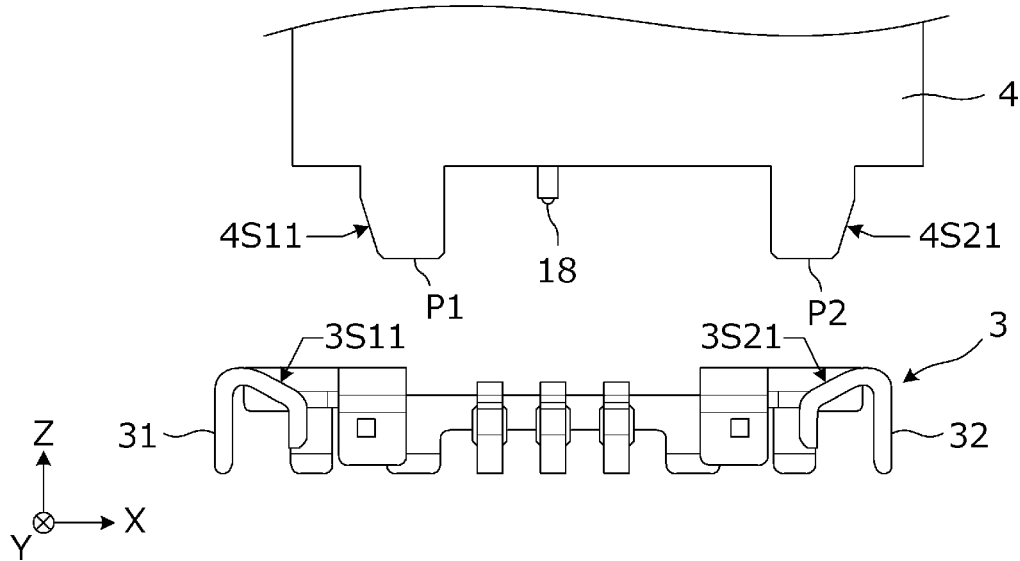
FIGS. 8A, 8B, and 8C illustrate vertical sections at stages in a process of fitting the plunger of the probe to the connector.
Figure 8B:
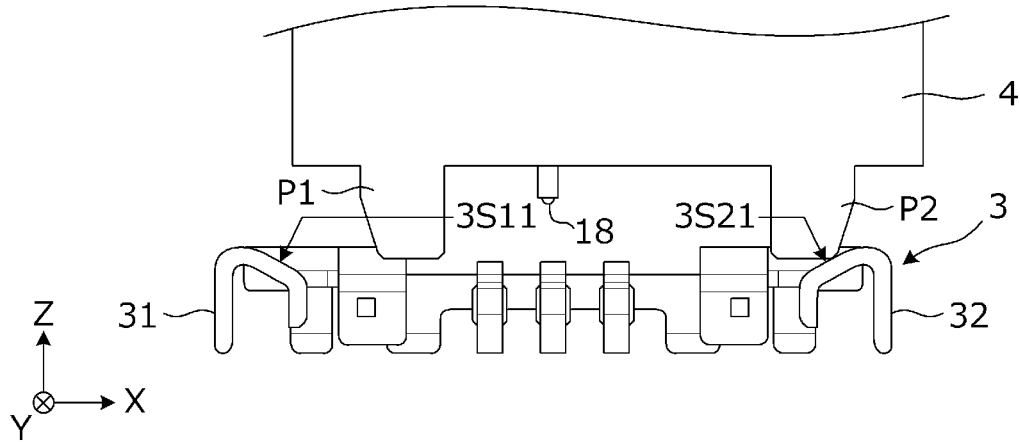
Figure 8C:
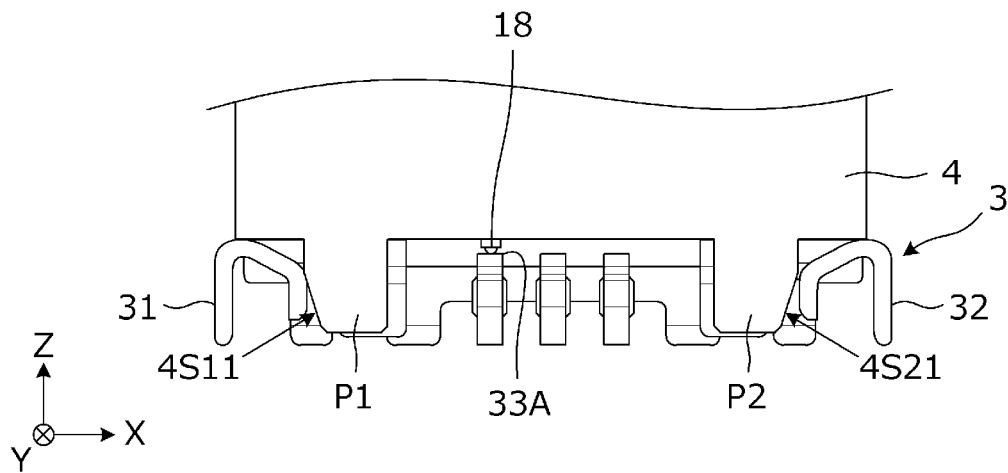

FIGS. 8A, 8B, and 8C illustrate vertical sections at stages in a process of fitting the plunger 4 of the probe 2 to the connector 3. As illustrated in FIG. 8A, the protruding portion P1 of the plunger 4 includes the slope portion 4S11, and the protruding portion P2 thereof includes the slope portion 4S21. Each of the protruding portions P1 and P2 is thinner in its leading end portion than in its base end portion. In that way, the slope portion 4S11 is present in the protruding portion P1, and the slope portion 4S21 is present in the protruding portion P2.

As illustrated in FIG. 8A, the metal frame 31 of the connector 3 includes the slope portion 3S11, and the metal frame 32 thereof includes the slope portion 3S21. Each of the slope portions 3S11 and 3S21 slopes in the direction in which it is thinner in its leading end portion than in its base end portion.

When the plunger 4 of the probe 2 in the state illustrated in FIG. 8A is downwardly moved toward the connector 3, the plunger 4 is in the state illustrated in FIG. 8B. In this example, the protruding portion P2 of the plunger 4 is in contact with the metal frame 32 of the connector 3. That is, the protruding portion P2 is in contact with the slope portion 3S21 of the metal frame 32. When the plunger 4 in that state is downwardly moved, the protruding portion P2 slides along the slope portion 3S21 of the metal frame 32, and the plunger 4 receives a stress in a leftward direction illustrated in FIG. 8B. After that, when the plunger 4 is further downwardly moved toward the connector 3, as illustrated in FIG. 8C, a projecting portion of the metal frame 32 of the connector 3 slides in contact with the slope portion 4521 of the protruding portion P2. In that movement, the plunger 4 further receives the stress in the leftward direction illustrated in FIG. 8B. The leading end of each of the protruding portions P1 and P2 projects further than the leading end of the probe pin 18. That is, the length from the base end portion to the leading end portion of each of the protruding portions P1 and P2 is longer than the length from the base end portion to the leading end portion of the probe pin 18. The probe pin 18 is positioned between the protruding portions P1 and P2 as seen in plan view. As illustrated in FIG. 4B, a part of the probe pin 18 is positioned within the area surrounded by the outer shape line OL of the group of the protruding portions P1 and P2 when the base end portion PE of the plunger 4 is seen in plan view.

In that structure, the collision of the probe pin 18 with a member different from an electrode to be measured of the connector before fitting can be suppressed. The effects of noise from the outside can also be suppressed.

Finally, as illustrated in FIG. 8C, the plunger 4 stops in the state where the projecting portion of the metal frame 32 of the connector 3 is in contact with the slope portion 4S21 of the protruding portion P2 and a projecting portion of the metal frame 31 is in contact with the slope portion 4S11 of the protruding portion P1. That is, in that state, the protruding portions P1 and P2 of the plunger 4 are fitted to the opening portions H1 and H2 (see FIG. 5) of the connector 3. Then, the probe pin 18 protruding from the leading end portion of the plunger 4 comes into contact with the connection electrode 33A and becomes electrically connected. In that way, a signal applied to or flowing through the connection electrode 33A can be inspected.

In the example illustrated in FIG. 8, the movement in the relative positional relationship between the connector 3 and the plunger 4 in an in-plane direction parallel with the X-Z plane is described. That movement is similar to movement in the relative positional relationship between the connector 3 and the plunger 4 in an in-plane direction parallel with the Y-Z plane. That is, as illustrated in FIG. 3, the protruding portions P1 and P2 include not only the slope portions 4S11 and 4S21, which slope from the plane parallel with the Y-Z plane, but also the slope portions 4S12 and 4S22, which slope from the plane parallel with the X-Z plane. As illustrated in FIG. 5, at the opening portions H1 and H2, not only the slope portions 3S11 and 3S21, which slope from the plane parallel with the Y-Z plane, but also the slope portions 3S12 and 3S22, which slope from the plane parallel with the X-Z plane, are present. Therefore, as for the relative position between the connector 3 and the plunger 4 in the in-plane direction parallel with the Y-Z plane, both are also guided. Accordingly, the connector 3 and the plunger 4 are guided to a proper positional relationship in each of the X direction and the Y direction, and the operability in fitting can be enhanced.

In the example described above, the opening portions H1 and H2 of the connector 3 are provided in two places between which the plurality of connection electrodes 33 are arranged. When the plurality of connection electrodes are arranged in a plurality of rows, the protruding portions of the plunger 4 may be fitted to grooves sandwiched between the above rows within the area where the connection electrodes 33 are arranged. For example, in the example illustrated in FIG. 5, the plurality of connection electrodes may form two grooves G1 and G2, and the plunger 4 may include protruding portions capable of being fitted to the two grooves G1 and G2. In that structure, the place where the connector 3 and the plunger 4 are fitted can be long, and thus the strength of fitting the plunger 4 to the connector 3 and its positional accuracy can be enhanced.

In the above-illustrated example, the probe 2 including the single probe pin 18 is used. The probe 2 may include a plurality of probe pins. In that case, measurement can be conducted while the probe pins are in contact with the plurality of connection electrodes, respectively, at the same time.

In the above case where the plurality of probe pins are disposed, it may be preferable that the plurality of connection electrodes of the connector 3 be in 180-degree rotationally symmetrical positions at an orthogonal plane (X-Y plane) to the direction in which the probe 2 comes into contact or becomes separated (Z direction) and that the probe 2 be capable of being fitted to the connector 3 in two positions having 180-degree rotational symmetry. In that case, it may be preferred that the plurality of probe pins be positioned such that they are capable of coming into contact with different respective connection electrodes of the plurality of connection electrodes in the two fitting states (first fitting state and second fitting state) having 180-degree rotational symmetry. In that case, because there is no overlap between the connection electrodes in contact with the plurality of probe pins in one of the two fitting states and those in the other fitting state, even the small number of probe pins can be in contact with the large number of connection electrodes. For example, if the probe 2 includes three probe pins capable of coming into contact with the connection electrodes 33A, 33B, and 33C illustrated in FIG. 6 in the first fitting state, the three probe pins can come into contact with the connection electrodes 33D, 33E, and 33F in the second fitting state. In another example case, if the probe 2 includes three probe pins capable of coming into contact with the connection electrodes 33A, 33E, and 33C in the first fitting state, the three probe pins can come into contact with the connection electrodes 33D, 33B, and 33F in the second fitting state. In that way, because the small number of probe pins can come into contact with the large number of connection electrodes, the distance between neighboring probe pins can be long, and signal isolation between the probe pins can be easily obtained.

In the above-described examples, measurement is conducted in each of the two fitting states. The probe 2 may include a plurality of probe pins capable of coming into contact with all of the plurality of connection electrodes in a one-to-one relationship. In that configuration, measurement can be conducted for all of the connection electrodes in a single fitting state.

Second Embodiment

In a second embodiment, a probe having a structure of a fitting portion between the plunger and the connector different from that in the first embodiment is illustrated.

Figure 9:
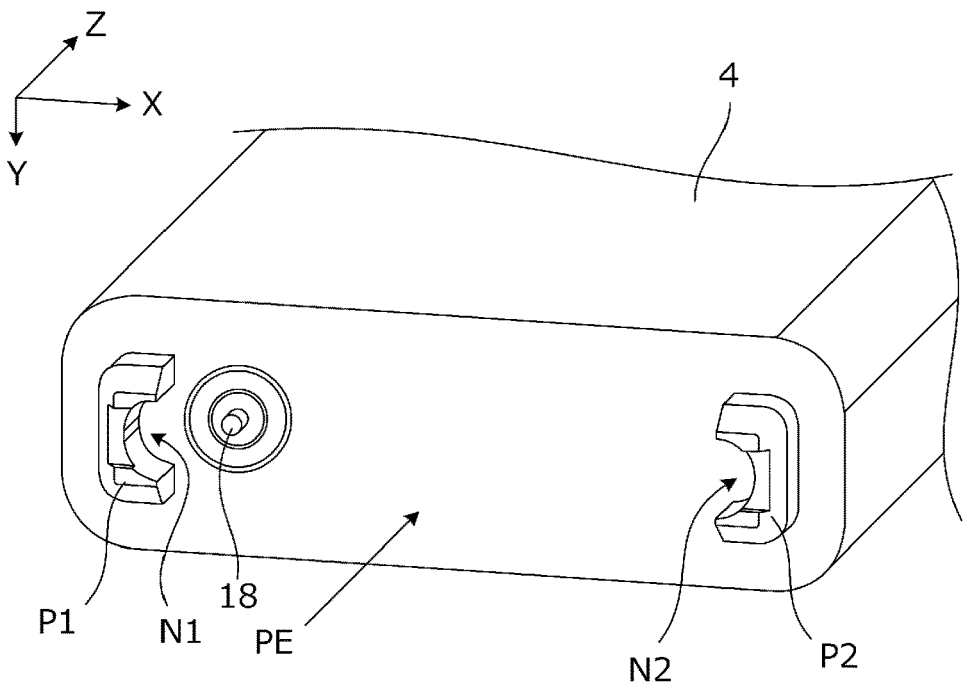
FIG. 9 is a perspective view of a leading end portion of the plunger of the probe according to a second embodiment.
Figure 10A:
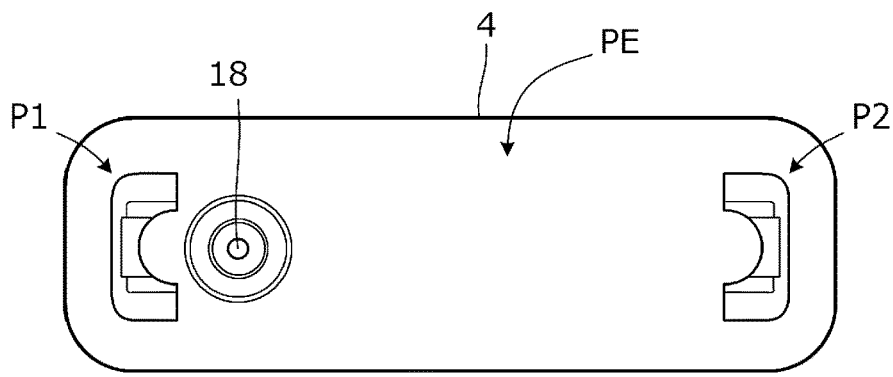
FIG. 10A is an enlarged plan view of the base end portion of the plunger.
Figure 10B:
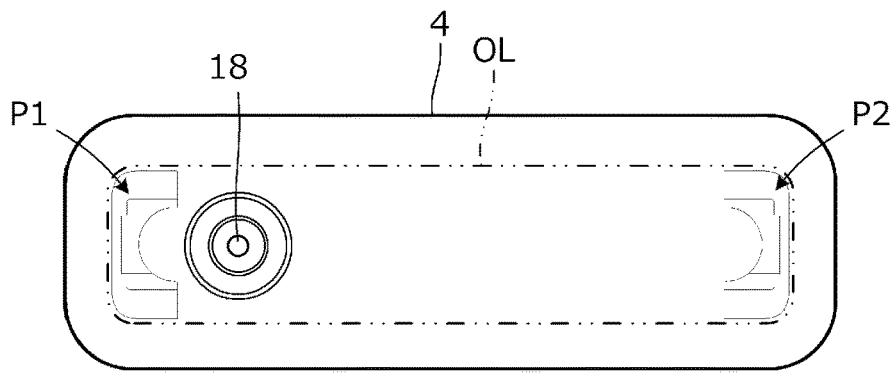
FIG. 10B illustrates a positional relationship between the protruding portions and the probe pin.
Figure 11:
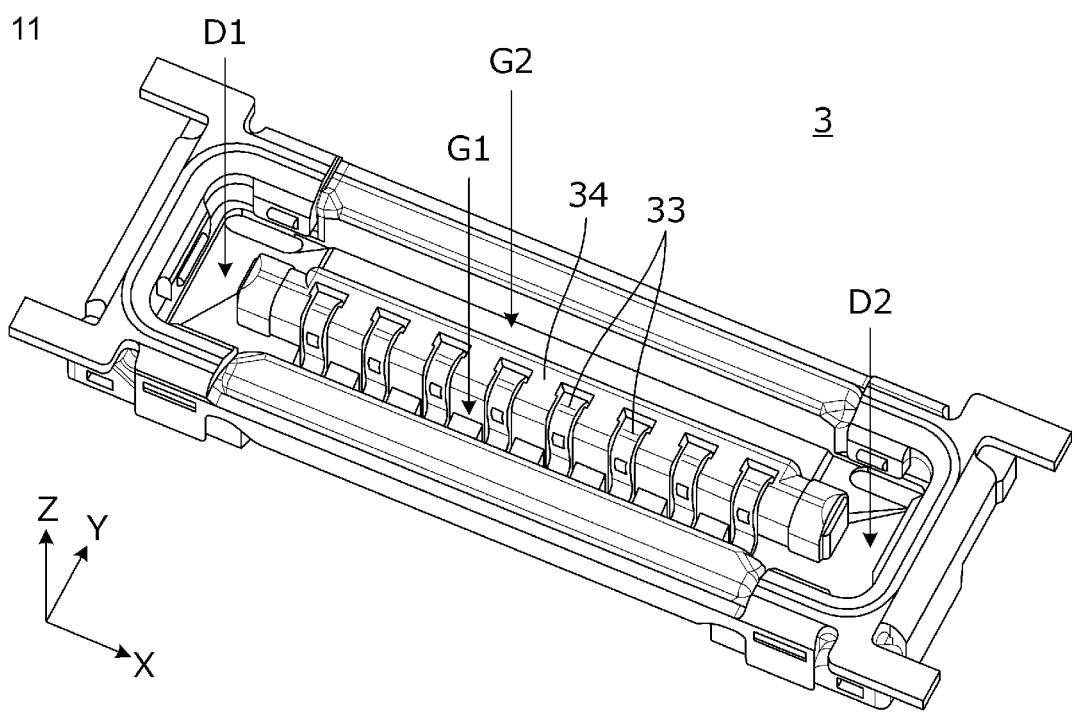
FIG. 11 is a perspective view of the connector to which the plunger illustrated in FIG. 9 is to be fitted.

FIG. 9 is a perspective view of a leading end portion of the plunger 4 of the probe according to the second embodiment. FIG. 10A is an enlarged plan view of the base end portion PE of the plunger 4, and FIG. 10B illustrates a positional relationship between the protruding portions P1 and P2 and the probe pin 18. FIG. 11 is a perspective view of the connector 3 to which the plunger 4 illustrated in FIG. 9 is to be fitted. The probe pin 18 and the protruding portions P1 and P2 protrude from the leading end portion of the plunger 4. The protruding portions P1 and P2 correspond to a "plunger-side fitting portion" according to the present disclosure. The configuration other than that illustrated in FIGS. 9, 10, and 11 is the same as that illustrated in the first embodiment.

In FIG. 10B, the outer shape line OL of the group of the two protruding portions P1 and P2 is illustrated. The probe pin 18 fully lies within the area surrounded by the outer shape line OL of the group of the plurality of (two in this example) protruding portions P1 and P2 when the base end portion PE of the plunger 4 is seen in plan view. In such a structure, the collision of the probe pin 18 with a member different from an electrode to be measured of the connector before fitting can be suppressed. The effects of noise from the outside can also be further suppressed.

As illustrated in FIG. 11, the connector 3 includes a connection-electrode holding bar 34 for holding the plurality of connection electrodes 33 arranged in a row. Recesses D1 and D2 are disposed near both ends of the connection-electrode holding bar 34.

As illustrated in FIG. 9, the protruding portions P1 and P2 have cut portions N1 and N2, respectively. The cut portions N1 and N2 are portions for providing a clearance from the connection electrode 33 or the connection-electrode holding bar 34. The connection-electrode holding bar 34 corresponds to a "holding portion for the connection electrodes" according to the present disclosure. That is, in the state where the protruding portions P1 and P2 illustrated in FIG. 9 are fitted to the recesses D1 and D2 of the connector 3 illustrated in FIG. 11, a predetermined clearance between the protruding portions P1 and P2 and the connection electrodes 33 or the connection-electrode holding bar 34 can be provided. Therefore, the protruding portions P1 and P2 do not suffer from the interference with the connection-electrode holding bar 34. Because the protruding portions P1 and P2 are not unnecessarily close to the connection electrodes 33, there are no adverse effects on the electric characteristics during measurement.

Even in the positional relationship where the protruding portions P1 and P2 illustrated in FIG. 9 do not interfere with the connection-electrode holding bar 34, the cut portions N1 and N2 are effective. That is, the risk of breakage of the connection-electrode holding bar 34 or the connection electrodes 33 in the connector 3 caused by contact from the protruding portions P1 and P2 in the course of an operation of fitting the plunger 4 to the connector 3 (guiding operation) can be reduced.

The above-described cut portions N1 and N2 may have shapes and dimensions at which both ends of the connection-electrode holding bar 34 are sandwiched therebetween in the X direction or Y direction. In that case, the strength of fitting the plunger 4 to the connector 3 can be enhanced.

In the example illustrated in FIGS. 9-11, the recesses D1 and D2 of the connector 3 are in two places between which the area where the plurality of connection electrodes 33 are arranged is disposed. If the plurality of connection electrodes are arranged in a row, the protruding portions of the plunger 4 may be fitted to a groove extending along the row within the area where the connection electrodes 33 are arranged. For example, in the example illustrated in FIG. 11, the grooves G1 and G2 may be disposed between the connection-electrode holding bar 34 and an outer frame portion of the connector, and the plunger 4 may include a protruding portion or protruding portions capable of being fitted to one or both of the grooves G1 and G2. In that structure, the place where the connector 3 and the plunger 4 are fitted can be long, and thus the strength of fitting the plunger 4 to the connector 3 and its positional accuracy can be enhanced.

In the first embodiment and the second embodiment, the examples where the connector-side fitting portion and the plunger-side fitting portion are in positions having 180-degree rotational symmetry. Thus, the plunger 4 can be fitted to the connector 3 in two states of 0 degree and 180 degrees. Therefore, the position of a connection electrode of the connector with which the probe pin 18 comes into contact can be selected by changing the orientation of the plunger 4 to the connector 3.

Finally, the above description of the embodiments is illustrative and not restrictive in all respects. Modifications and changes can be made by those skilled in the art if needed. The scope of the present disclosure is indicated not by the above-described embodiments but by the claims.

Furthermore, the scope of the present disclosure includes changes from the embodiments within the scope equivalent to the claims.

For example, the number of plunger-side fitting portions and that of connector-side fitting portions are not limited to two and may be one or three or more.

In the examples illustrated above, the connector-side fitting portions are depressions, such as the opening portions H1 and H2, the grooves G1 and G2, and the recesses D1 and D2, and the plunger-side fitting portions are the protruding portions P1 and P2. In contrast, the connector-side fitting portions may be protruding portions, and the plunger-side fitting portions may be depressions, such as opening portions, grooves, and recesses, capable of being fitted to the connector-side fitting portions.

What is claimed is:

1. A probe fitting structure comprising:
    a connector to be inspected, the connector including a plurality of connection electrodes; and
    a probe configured to fit to the connector, the probe including
        a flange having a through hole,
        a coaxial cable extending through the through hole and including a leading end portion to which at least one probe pin is attached,
        a plunger including a leading end through which the at least one probe pin is exposed, and at least one plunger-side fitting portion in a leading end portion of the plunger, and
        a spring housing the coaxial cable between the flange and the plunger, and including a first end portion fixed to the flange and a second end portion fixed to the plunger, and
    the connector includes at least one connector-side fitting portion configured to fit to the at least one plunger-side fitting portion while being in contact with an outer side surface of the plunger-side fitting portion,
    wherein the at least one plunger-side fitting portion is a protruding portion, the at least one connector-side fitting portion is a depression allowing the plunger-side fitting portion to be inserted therein, and the protruding portion has a cut portion for providing a clearance from the connection electrodes or a holding portion for the connection electrodes.

2. The probe fitting structure according to claim 1, wherein
    the at least one probe pin comprises a plurality of probe pins,
    the connector includes the plurality of connection electrodes allowing the probe pins to come into contact therewith,
    the plurality of connection electrodes are in positions having 180-degree rotational symmetry in an orthogonal plane to a direction in which the probe comes into contact or becomes separated, and
    the plurality of probe pins are disposed in positions where they come into contact with different respective connection electrodes of the plurality of connection electrodes before and after the 180-degree rotation about a central axis of the 180-degree rotation of the connector.

3. The probe fitting structure according to claim 1, wherein
    the connector includes the plurality of connection electrodes, and
    the at least one probe pin comprises a plurality of probe pins capable of coming into contact with all of the plurality of connection electrodes in a one-to-one relationship.

4. The probe fitting structure according to claim 1, wherein
    the at least one connector-side fitting portion comprises a plurality of connector-side fitting portions in places between which an area where the plurality of connection electrodes are arranged is disposed, and
    the at least one plunger-side fitting portion is fitted to each of the plurality of connector-side fitting portions.

5. The probe fitting structure according to claim 1, wherein
    the plurality of connection electrodes are arranged in a row, and
    the at least one plunger-side fitting portion has a shape extending along the row within an area where the plurality of connection electrodes are arranged.

6. The probe fitting structure according to claim 1, wherein
    both or one of the protruding portion and the depression includes a slope portion where its leading end portion is thinner than its base end portion in a direction of the insertion, and the slope portion is used for guiding the protruding portion to a proper position with respect to the depression.

7. A probe fitting structure comprising:
    a connector to be inspected, the connector including a plurality of connection electrodes; and
    a probe configured to fit to the connector, the probe including
        a flange having a through hole,
        a coaxial cable extending through the through hole and including a leading end portion to which at least one probe pin is attached,
        a plunger including a leading end through which the at least one probe pin is exposed, and at least one plunger-side fitting portion in a leading end portion of the plunger, and
        a spring housing the coaxial cable between the flange and the plunger and including a first end portion fixed to the flange and a second end portion fixed to the plunger, and
    the connector includes at least one connector-side fitting portion configured to fit to the at least one plunger-side fitting portion while surrounding the at least one plunger-side fitting portion,
    wherein the at least one plunger-side fitting portion is a protruding portion, the at least one connector-side fitting portion is a depression allowing the plunger-side fitting portion to be inserted therein, and the protruding portion has a cut portion for providing a clearance from the connection electrodes or a holding portion for the connection electrodes.

8. The probe fitting structure according to claim 7, wherein
    the at least one probe pin comprises a plurality of probe pins,
    the connector includes the plurality of connection electrodes allowing the probe pins to come into contact therewith,
    the plurality of connection electrodes are in positions having 180-degree rotational symmetry in an orthogonal plane to a direction in which the probe comes into contact or becomes separated, and the plurality of probe pins are disposed in positions where they come into contact with different respective connection electrodes of the plurality of connection electrodes before and after the 180-degree rotation about a central axis of the 180-degree rotation of the connector.

9. The probe fitting structure according to claim 7, wherein
the connector includes the plurality of connection electrodes, and
the at least one probe pin comprises a plurality of probe pins capable of coming into contact with all of the plurality of connection electrodes in a one-to-one relationship.

10. The probe fitting structure according to claim 7, wherein
the at least one connector-side fitting portion comprises a plurality of connector-side fitting portions in places between which an area where the plurality of connection electrodes are arranged is disposed, and
the at least one plunger-side fitting portion is fitted to each of the plurality of connector-side fitting portions.

11. The probe fitting structure according to claim 7, wherein
the plurality of connection electrodes are arranged in a row, and
the at least one plunger-side fitting portion has a shape extending along the row within an area where the plurality of connection electrodes are arranged.

* * * * *